US012813052B2

(12) United States Patent
Robin et al.

(10) Patent No.: US 12,813,052 B2
(45) Date of Patent: Nov. 24, 2026

(54) ELECTRONIC SYSTEM COMPRISING A PRE-EXISTING ACCESS STRUCTURE, AND METHOD FOR PRODUCING SUCH A SYSTEM

(71) Applicant: ALEDIA, Échirolles (FR)

(72) Inventors: Ivan-Christophe Robin, Grenoble (FR); Bruno Mourey, Coublevie (FR)

(73) Assignee: ALEDIA, Échirolles (FR)

( * ) Notice: Subject to any disclaimer, the term of this patent is extended or adjusted under 35 U.S.C. 154(b) by 375 days.

(21) Appl. No.: 18/568,975

(22) PCT Filed: Jun. 9, 2022

(86) PCT No.: PCT/FR2022/051102
§ 371 (c)(1),
(2) Date: Dec. 11, 2023

(87) PCT Pub. No.: WO2022/263749
PCT Pub. Date: Dec. 22, 2022

(65) Prior Publication Data

US 2024/0282899 A1 Aug. 22, 2024

(30) Foreign Application Priority Data

Jun. 14, 2021 (FR) ..................................... 21/06255

(51) Int. Cl.
*H10H 20/857* (2025.01)
*H10W 90/00* (2026.01)
*H10H 20/01* (2025.01)

(52) U.S. Cl.
CPC .......... *H10H 20/857* (2025.01); *H10W 90/00* (2026.01); *H10H 20/0364* (2025.01)

(58) Field of Classification Search
CPC .. H10H 20/857; H10H 20/0364; H10W 90/00
See application file for complete search history.

(56) References Cited

U.S. PATENT DOCUMENTS

2014/0367705 A1* 12/2014 Bibl .................. H10W 72/0198 438/27
2019/0371974 A1 12/2019 Hussell
2021/0183309 A1* 6/2021 Wu ........................ H10H 20/01

FOREIGN PATENT DOCUMENTS

CN 211265476 U 8/2020

OTHER PUBLICATIONS

International Search Report for corresponding application PCT/FR2022/051102 filed Jun. 9, 2022; Mail date Sep. 23, 2022.

* cited by examiner

*Primary Examiner* — Tucker J Wright
(74) *Attorney, Agent, or Firm* — CANTOR COLBURN LLP

(57) ABSTRACT

The invention relates to an electronic system (10) comprising: an initial electronic device (7) comprising a lower connection terminal (9) and an upper connection terminal (11): a lower electrically conductive element (3) configured to be electrically connected to the initial electronic device (7): an electrically insulating spacer layer (5) configured to interact with the initial electronic device (7) in such a way as to ensure electrical insulation between the lower electrically conductive element (3) and the upper connection terminal (11): an upper electrically conductive element (13) configured to be connected to the upper connection terminal (11) of said at least one initial electronic device (7): a pre-existing structure giving access to the lower electrically conductive element (3) from an upper face of the electrically insulating spacer layer (5). The invention also relates to a method for producing such an electronic system (10).

20 Claims, 9 Drawing Sheets

(E07)

(E09)

(E2)

(E5, E6)

(E2, E5, E6)

(E12)

ELECTRONIC SYSTEM COMPRISING A PRE-EXISTING ACCESS STRUCTURE, AND METHOD FOR PRODUCING SUCH A SYSTEM

TECHNICAL FIELD

The present disclosure relates to an electronic system comprising an initial electronic device connected by a lower connection terminal and an upper connection terminal.

The disclosure also relates to a method for manufacturing such an electronic system.

BACKGROUND

In the field of electronic systems of the optoelectronic device type like, for example, luminous display screens, the luminous elements constituting the screen must be arranged in a matrix-like fashion. The accuracy necessary for the formation of such a matrix increases as the resolution expected for the screens increases.

It is known to produce the light-emitting diodes that constitute the luminous elements on a first support, for example a silicon or sapphire wafer, and transfer them onto a second support intended to form an integral part of the screen. The electrical connections that allow powering the light-emitting diodes thus transferred are made at the level of the second support.

In the case where the light-emitting diodes are separated by a distance smaller than about ten microns, the electrical connection of each light-emitting diode remains difficult to achieve without any risk of unintentional short-circuit, due to the short distance that separates them.

In the case where the light-emitting diodes are three-dimensional, typically wired-shaped which is a very advantageous shape, obtaining an electrical connection of their upper portion is difficult because of their micrometric or even nanometric dimensions. An additional problem encountered during the transfer of the luminous elements is that the accurate positioning of the luminous elements at the level of the second support is not guaranteed in a certain manner because of the increasingly small dimensions of the luminous elements and of the electrical connections in order to obtain the best possible resolution for the luminous display offered by the optoelectronic device. The usual techniques for resuming the electrical contacts on the luminous elements are not satisfactory because the positioning defects are random and feature an excessively high error range with regards to the dimensions of the luminous elements and of the electrical connections.

Given this complicated context, it is increasingly frequent to wish to use light elements each in the form of a "smart-pixel" (which comprises at least one light-emitting diode having an active portion able to emit the light when a current crosses the active portion and an electronic control device configured to modulate at least one emission parameter associated with at least one of the light-emitting diodes included in the luminous element) having a lower connection terminal intended to be electrically connected to a lower electrically-conductive element and an upper connection terminal intended to be connected to an upper electrically-conductive element. Thus, the fact of being able to arrange the upper and lower electrically-conductive elements respectively on either side of an insulating encapsulation layer in which the smart pixels are embedded guarantees a decrease in the accuracy required for the positioning of the smart pixels with respect to the upper and lower electrically-conductive elements.

Yet, this layout is problematic because the fact that the luminous elements are encapsulated makes a possible intervention on a given luminous element or a repair by substitution very difficult and even impossible, in particular in the case where a luminous element proves to be defective (absence of light emission despite a power supply or an emission of a light that does not correspond to that expected one in terms of color or intensity).

To overcome the need for repair by replacement, a technique could have been able to consider a redundancy of the luminous elements by doubling or tripling each luminous element, but it is obvious that this solution is very problematic for reasons related to high costs and complexification of the manufacture and of the obtained structure.

While the previous problems have been encountered with a luminous element of the smart-pixel type, they are posed in an identical manner in the case where the transferred objects are just light-emitting diodes alone (that is to say with no electronic control device) or just an electronic control device capable of controlling the light-emitting diodes.

BRIEF SUMMARY

The present disclosure aims to provide a solution that addresses all or part of the aforementioned problems:

This aim may be achieved thanks to the implementation of an electronic system comprising:

- a support having an upper surface;
- at least one initial electronic device comprising a lower connection terminal and an upper connection terminal, said lower and upper connection terminals being located at opposite ends of the initial electronic device;
- a lower electrically-conductive element formed on the upper surface of said support and configured to be electrically connected to the lower connection terminal of said at least one initial electronic device;
- an electrically-insulating interlayer having a lower face directed towards the upper surface of the support, so as to cover all or part of the lower electrically-conductive element, said electrically-insulating interlayer being configured to cooperate with the initial electronic device in a manner ensuring an electrical insulation between the lower electrically-conductive element and the upper connection terminal;
- at least one upper electrically-conductive element formed on an upper face of the electrically-insulating interlayer, on the side opposite to the lower electrically-conductive element with respect to the electrically-insulating interlayer, said at least one upper electrically-conductive element being configured to be connected to the upper connection terminal of said at least one initial electronic device;
- a pre-existing structure providing access to the lower electrically-conductive element from the upper face of the electrically-insulating interlayer.

The previously-described arrangements allow providing an electronic system comprising a pre-existing structure, like a transverse conduit, which is configured to allow access to the lower electrically-conductive element once the initial electronic device is encapsulated in the electrically-insulating interlayer. Thus, it is possible to make an electrical connection with the lower electrically-conductive element during the manufacture of the electronic system and in particular after encapsulation of the electronic devices.

Hence, it should be well understood that the pre-existing structure may provide electrical access by an electrical connection with the lower electrically-conductive element from the upper face of the electrically-insulating interlayer. For example, said electrical connection may be achieved using solder bumps, solder paste, laser-welded nickel-gold pads, an ACF (anisotropic conductive film) film, or indium beads.

The electronic system may further have one or more of the following features, considered separately or in combination.

According to one embodiment, the pre-existing structure opens out at the level of the upper face of the electrically-insulating interlayer in an access area, said access area being disjoint from the upper electrically-conductive element.

In this manner, it is possible to ensure an electrical connection with the lower electrically-conductive element without creating a short-circuit between the lower connection terminal and the upper connection terminal of the initial electronic device.

In other words, the pre-existing structure is disjoint from the upper connection terminal and/or from the upper electrically-conductive element.

According to one embodiment, the lower and upper connection terminals of the initial electronic device are located on opposite faces of the initial electronic device.

According to one embodiment, the at least one initial electronic device is encapsulated in the electrically-insulating interlayer. In other words, the at least one initial electronic device is embedded in the electrically-insulating interlayer. For example, the electrically-insulating interlayer may be made of a planarization material configured to encapsulate a plurality of initial electronic devices.

According to one embodiment, the pre-existing structure comprises a conduit crossing the electrically-insulating interlayer transversely and defining a passage through the electrically-insulating interlayer between the lower electrically-conductive element and an upper orifice opening out onto the upper face of the electrically-insulating interlayer.

According to one embodiment, the electronic system comprises an interposer connector arranged inside a volume delimited by the transverse conduit, said interposer connector being in electrical connection with the lower electrically-conductive element, and opening out through the upper orifice of the transverse conduit.

According to one embodiment, the interposer connector comprises a metal deposited in the transverse conduit so as to fill all or part of a volume delimited by the transverse conduit.

According to an embodiment, at least one portion of the upper face of the electrically-insulating interlayer and at least one portion of the at least one upper electrically-conductive element define a docking location configured to receive an auxiliary electronic device which is able to be functionally substituted for the initial electronic device.

According to one embodiment, the electronic system comprises at least two docking locations, said docking locations being defined by two distinct areas each covering a portion of the at least one upper electrically-conductive electrical element and at least one portion of the upper face of the electrically-insulating interlayer. In this manner, it is possible to place several auxiliary electronic devices on each docking location.

Hence, one should clearly understand that the principle of the previously-described arrangements allows replacing the initial electronic device when it is defective by placing the auxiliary electronic device at the level of the docking location. Advantageously, the transverse conduit allows connecting the auxiliary electronic device to the lower electrically-conductive element. Moreover, the auxiliary electronic device may be connected to the upper electrically-conductive element.

According to one embodiment, the auxiliary electronic device is an electronic device identical to the initial electronic device, or of the same nature as the initial electronic device.

By "devices of the same nature", it should be understood electronic devices able to fill the same function. For example, devices of the same nature may be devices able to emit light, and/or devices able to capture light, and/or devices able to emit light at a given wavelength. Hence, it should be well understood that devices of the same nature may have different dimensions and/or a different structure as long as they fill the same function.

According to one embodiment, the auxiliary electronic device comprises a primary connection terminal configured to be electrically connected to the lower electrically-conductive element, and a secondary connection terminal configured to be electrically connected to the upper electrically-conductive element.

According to one embodiment, the auxiliary electronic device is contained in a volume larger than that in which the initial electronic device is contained. For example, the auxiliary electronic device may have a micrometric dimension. In this manner, it is easier to handle the auxiliary electronic device in order to position it on the docking location.

According to one embodiment, the auxiliary electronic device comprises the interposer connector.

According to one embodiment, the auxiliary electronic device comprises a primary connection terminal configured to be electrically connected to the lower electrically-conductive element, and a secondary connection terminal configured to be electrically connected to the upper electrically-conductive element, said primary connection terminal and secondary connection terminal being arranged on a connection face of the auxiliary electronic device arranged opposite the upper face of the electrically-insulating interlayer.

Thus, and unlike the lower and upper terminals of the initial electronic device located at opposite ends of the initial electronic device, the primary and secondary connection terminals of the auxiliary electronic device may be arranged on the same connection face of the auxiliary electronic device, said connection face being oriented towards the upper face of the electrically-insulating interlayer.

According to one embodiment, the auxiliary electronic device defines a volume strictly larger than a volume defined by the at least one initial electronic device. In other words, each auxiliary electronic device is larger than the initial electronic device that it is intended to replace.

According to one embodiment, the largest dimension of the auxiliary electronic device is strictly larger than the largest dimension of the at least one initial electronic device.

According to one embodiment, the interposer connector may be provided on the auxiliary electronic device so as to be able to be inserted into the transverse conduit.

According to one embodiment, the electronic system comprises an electrical connection member configured to ensure an electrical connection between the auxiliary electronic device and the interposer connector. For example, the connection member may be included on the primary connection terminal of the auxiliary electronic device. Alternatively, the electrical connection member may be included on the interposer connector, or deposited over the upper face of the electrically-insulating interlayer so as to be electrically connected to the interposer connector.

According to one embodiment, the electronic system comprises an auxiliary electronic device, said auxiliary electronic device comprising a primary connection terminal, and being configured to be able to be inserted into the transverse conduit in a manner ensuring an electrical connection between the primary connection terminal and the lower electrically-conductive element.

By "electrical connection", it should be understood a connection made by solder bumps, solder paste, laser-welded nickel-gold pads, an ACF (anisotropic conductive film) film, or indium beads.

According to one embodiment, the primary and secondary connection terminals are located at opposite ends of the auxiliary electronic device. Thus, the auxiliary electronic device is identical or of the same type as the initial electronic device.

According to one embodiment, the auxiliary electronic device is intended to have an outer contour dimension strictly smaller than an inner dimension of the transverse conduit, in order to be able to be inserted into the transverse conduit.

According to one embodiment, the transverse conduit crosses the upper electrically-conductive element. In this case, the auxiliary electronic device may be inserted into the transverse conduit in a manner ensuring an electrical connection between the primary connection terminal, and the lower electrically-conductive element.

According to one embodiment, the electronic system comprises:

- a first initial electronic device comprising a first upper connection terminal and a first lower connection terminal, and
- a second initial electronic device distinct from the first initial electronic device, and comprising a second upper connection terminal and a second lower connection terminal;
- said first and second lower connection terminals being electrically connected to each other via the lower electrically-conductive element.

According to one embodiment, the electronic system comprises:

- a first upper electrically-conductive element in electrical connection with the first upper connection terminal; and
- a second upper electrically-conductive element, distinct from the first upper electrically-conductive element, in electrical connection with the second upper connection terminal;
- the pre-existing structure opening out onto the upper face of the electrically-insulating interlayer in an area located between the first upper electrically-conductive element and the second upper electrically-conductive element.

According to one embodiment, the initial electronic device is an optoelectronic device comprising a light-emitting element.

For example, the light-emitting element may comprise at least one light-emitting diode able to emit and/or capture light, and possibly an electronic control component associated with said at least one light-emitting diode, such as for example a transistor.

According to one embodiment, the electronic system may comprise a number of lower electrically-conductive elements which is greater than or equal to two.

According to one embodiment, each lower electrically-conductive element comprises several electrically-conductive tracks extending substantially parallel to each other, each upper electrically-conductive element comprises several electrically-conductive tracks extending substantially parallel to each other, and the electrically-conductive tracks of the lower electrically-conductive element extend substantially perpendicular to the electrically-conductive tracks of the upper electrically-conductive element.

According to one embodiment, the electronic system is made in accordance with one of the embodiments described in the document WO2019008262, the content of which is incorporated by reference within the limits permitted by the law.

In this manner, it is possible to connect the initial electronic devices unitarily and in a matrix-like fashion via the lower and upper electrically-conductive elements. In this case, a first upper electrically-conductive element may be placed in electrical connection with the first upper connection terminal of a first initial electronic device, and a second upper electrically-conductive element, may be placed in electrical connection with the second upper connection terminal of a second initial electronic device.

Hence, it should be well understood that in the case of a matrix-like distribution of the initial electronic devices over the initial surface of the support:

- the initial electronic devices arranged on the same line will be connected to the same electrically-conductive track of the lower electrically-conductive element, and connected to two different electrically-conductive tracks of the upper electrically-conductive element; and
- the initial electronic devices arranged on the same column will be connected to the same electrically-conductive track of the upper electrically-conductive element, and connected to two different electrically-conductive tracks of the lower electrically-conductive element.

The aim of disclosure may also be achieved thanks to the implementation of a method for manufacturing an electronic system comprising the following steps:

- a step of providing an electronic system comprising a support having an initial surface, at least one initial electronic device, and an electrically-insulating interlayer, said initial electronic device comprising a lower connection terminal and an upper connection terminal, said lower and upper connection terminals being located at opposite ends of the initial electronic device, said electrically-insulating interlayer having a lower face directed towards the initial surface of the support, so as to cover all or part of a lower electrically-conductive element which is in electrical connection with the lower connection terminal of the initial electronic device;
- a step of depositing at least one upper electrically-conductive element over an upper face of the electrically-insulating interlayer, on the side opposite to the lower electrically-conductive element with respect to the electrically-insulating interlayer, in a manner ensuring an electrical connection between the upper connection terminal of said at least one device initial electronic element and said upper electrically-conductive element;
- a step of forming a pre-existing structure providing access to the lower electrically-conductive element from the upper face of the electrically-insulating interlayer.

Hence, one should clearly understand that the upper and lower connection terminals are located at opposite ends of the initial electronic device, opposite to each other according to a transverse direction directed orthogonally to the initial surface of the support.

Moreover, it should be understood that the upper orifice opens out onto the upper face of the electrically-insulating interlayer on the side of the at least one upper electrically-conductive element.

The previously-described arrangements allow providing a method for manufacturing an electronic system comprising means for enabling the repair of a defective initial electronic device. Indeed, the step of forming the transverse conduit, for example by etching the electrically-insulating interlayer, allows providing access to the lower electrically-conductive element, in particular after a step of depositing the electrically-insulating interlayer.

The manufacturing method may further have one or more of the following features, considered separately or in combination.

According to one embodiment, the step of forming a pre-existing structure comprises a step of forming a transverse conduit, formed in the electrically-insulating interlayer, so as to define a passage through the electrically-insulating interlayer between the lower electrically-conductive element and an upper orifice opening out onto the upper face of the electrically-insulating interlayer.

According to one embodiment, the step of forming the transverse conduit is also implemented through the upper electrically-conductive element.

According to one embodiment, the manufacturing method comprises a step of controlling the initial electronic device implemented after the step of forming the transverse conduit, wherein the initial electronic device is supplied with electrical energy so as to determine whether said initial electronic device is defective.

According to one embodiment, the step of controlling the initial electronic device may comprise measuring a current crossing the initial electronic device, or may comprise measuring a voltage at the connection terminals of the initial electronic device.

According to an embodiment wherein the initial electronic device is an optoelectronic device, the step of controlling the initial electronic device may comprise placing the initial electronic device in a mode in which it emits a light radiation, then detecting said light radiation via an optical sensor.

According to one embodiment, the manufacturing method further comprises a repair phase comprising the following steps:

- a step of providing an auxiliary electronic device able to be functionally substituted for the initial electronic device;
- a step of placing said auxiliary electronic device on a docking location, said docking location covering at least one portion of the upper electrically-conductive element, and at least one portion of the upper face of the electrically-insulating interlayer, said step of placing the auxiliary electronic device being implemented in a manner ensuring an electrical contact between a primary connection terminal of the auxiliary electronic device and the upper electrically-conductive element;
- a connection step, in which a primary connection terminal of the auxiliary electronic device is electrically connected with the lower electrically-conductive element via an interposer connector which is able to pass through a volume delimited by the transverse conduit.

According to one embodiment, the "electrical contact" ensured during the step of placing the auxiliary electronic device on the docking location, or the "electrical connection" of the primary connection terminal of the auxiliary electronic device with the lower electrically-conductive element is achieved by connection with solder bumps, solder paste, laser-welded nickel-gold pads, an ACF (anisotropic conductive film) film, or indium beads.

The previously-described arrangements allow providing a manufacturing method comprising a repair phase during which a defective initial electronic device may be functionally replaced by an auxiliary electronic device. Advantageously, the docking location may be provided to have a docking surface wide enough to receive the auxiliary electronic device. Thus, the placement of the auxiliary electronic device may be carried out unitarily and easily, and in particular after having encapsulated all of the initial electronic devices.

According to one embodiment, the auxiliary electronic device comprises the interposer connector in electrical connection with the primary connection terminal of the auxiliary electronic device in a manner enabling the implementation of the connection step.

According to one embodiment, the manufacturing method further comprises a step of depositing the interposer connector, in which a conductive material is deposited in the transverse conduit so as to create an electrical connection between said interposer connector and the lower electrically-conductive element, and so that the interposer connector opens out through the upper orifice of the transverse conduit.

According to one embodiment, the step of depositing the interposer connector comprises forming an electrical connection member configured to ensure an electrical connection between the auxiliary electronic device and the interposer connector. For example, the electrical connection member may be deposited over the upper face of the electrically-insulating interlayer during the step of depositing the interposer connector so as to be electrically connected to the interposer connector.

According to one embodiment, the step of depositing at least one upper electrically-conductive element is implemented at the same time as the step of depositing the interposer connector.

According to an embodiment wherein the auxiliary electronic device comprises a primary connection terminal and a secondary connection terminal, and wherein said primary connection terminal and secondary connection terminal are arranged on the same connection face of the auxiliary electronic device, the connection step is implemented by electrically connecting the secondary connection terminal with the upper electrically-conductive element, and by electrically connecting the primary connection terminal with the interposer connector opening out through the upper orifice of the transverse conduit.

Thus, and advantageously, when the step of depositing the interposer connector comprises depositing a connection member over the upper face of the electrically-insulating interlayer, the connection step may be simply implemented by electrically connecting the secondary connection terminal with the upper electrically-conductive element, and by electrically connecting the primary connection terminal to the connection member. In other words, the connection step is implemented by the electrical connection of the primary and secondary terminals of the auxiliary electronic device on existing electronic tracks. In this manner, it is not necessary to proceed with an additional metal deposition at the time when the auxiliary electronic device is placed to replace the initial electronic device. Hence, the repair of the initial electronic device is carried out by placing the auxiliary electronic device at the right place, that is to say by electrically connecting the secondary connection terminal with the upper electrically-conductive element, and by electrically connecting the primary connection terminal with the connection member.

According to one embodiment, the manufacturing method comprises a step of depositing a conductive transparent electrode implemented before the step of depositing at least one upper electrically-conductive element, wherein a conductive transparent electrode is deposited at the level of the upper connection terminal of the initial electronic device.

According to one embodiment, the manufacturing method comprises a disconnection step, in which the electrical connection between the upper connection terminal of the initial electronic device and the upper electrically-conductive element is broken, in particular by laser etching.

In this manner, it is possible to cut off the electrical connection between the upper electrically-conductive element and the upper connection terminal of the initial electronic device so that it does not cause a short-circuit or interferences with the auxiliary electronic device.

According to one embodiment, the step of providing the electronic system comprises the following steps:

- a step of providing the support having the upper surface;
- a step of depositing the lower electrically-conductive element over the upper surface of the support;
- a step of placing the initial electronic device over the upper surface in a manner ensuring an electrical connection between the lower connection terminal of the initial electronic device and the lower electrically-conductive element;
- a step of depositing the electrically-insulating interlayer over all or part of the upper surface of the support so as to cover the initial electronic device and the lower electrically-conductive element;
- a step of selectively etching the electrically-insulating interlayer in which the electrically-insulating interlayer is etched so as to provide access to the upper connection terminal of the initial electronic device.

According to one embodiment, the step of providing the electronic system comprises a step of depositing a securing means, for example an adhesive. The securing means being configured to secure the initial electronic device to the upper surface of the support.

According to one embodiment, the step of placing the initial electronic device comprises the distribution of a plurality of initial electronic devices over the upper surface of the support according to a predetermined spacing. For example, the predetermined spacing may be defined as the spacing separating two electronic devices on the support. For example, the predetermined spacing may be comprised between 50 μm and 2 mm, and more particularly substantially equal to 100 μm.

According to one embodiment, the step of forming the transverse conduit is carried out during the step of selectively etching the electrically-insulating interlayer.

According to one embodiment, during the step of depositing the upper electrically-conductive element, said deposition of the upper electrically-conductive element is carried out partly over a portion of the conductive transparent electrode. Thus, and advantageously, the conductive transparent electrode allows ensuring the electrical contact of the upper connection terminal with the upper electrically-conductive element, and enabling the transmission of the light radiation emitted by the optoelectronic device.

According to one embodiment, the step of selectively etching the electrically-insulating interlayer comprises the following steps:

- a step of depositing a photoresist layer over the electrically-insulating interlayer;
- a step of irradiating the photoresist layer by a light radiation throughout a lithography mask, said lithography mask defining primary areas intended to be irradiated by the light radiation, and secondary areas intended to be protected by the lithography mask against the irradiation of said light radiation;
- a step of developing the photoresist layer in which the photoresist is removed at the level of the primary areas or at the level of the secondary areas, so that the electrically-insulating interlayer is no longer covered with photoresist at the level of said areas where the resin layer has been removed, and so that the electrically-insulating interlayer is covered with the photoresist layer over the other areas;
- an etching step in which an etching of the electrically-insulating interlayer is carried out at the level of the areas not covered by the photoresist layer, and in which an etching of the photoresist layer is carried out on the other areas.

According to one embodiment, the manufacturing method further comprises a protection step comprising the deposition of a protective insulating layer over the auxiliary electronic device.

For example, said protection step may comprise the encapsulation of the auxiliary electronic device by a protective insulating layer, the surface of which corresponds, within a 10% margin, to a surface occupied by the auxiliary electronic device. In this case, the protective insulating layer may be deposited punctually at the level of each auxiliary electronic device to be protected.

Alternatively, said protection step may comprise the encapsulation of the whole of the upper face of the electrically-insulating interlayer, or of the entirety of the electronic system.

According to one embodiment, the protection step is implemented after the connection step. In this manner, the protective insulating layer allows encapsulating the auxiliary electronic devices, but also blocking access to the lower electrically-conductive element from the upper face of the electrically-insulating interlayer. Thus, it is possible to limit the degradation of the upper electrically-conductive element, and of the upper electrically-conductive element, while avoiding short-circuits.

BRIEF DESCRIPTION OF THE DRAWINGS

Other aspects, aims, advantages and features of the disclosure will appear better upon reading the following detailed description of preferred embodiments thereof, given as a non-limiting example, and made with reference to the appended drawings, wherein.

DETAILED DESCRIPTION

In the figures and in the following description, the same references represent identical or similar elements. In addition, the different elements are not represented to scale so as to favor clarity of the figures. Moreover, the various embodiments and variants do not exclude one another and can be combined together.

Figure 1:
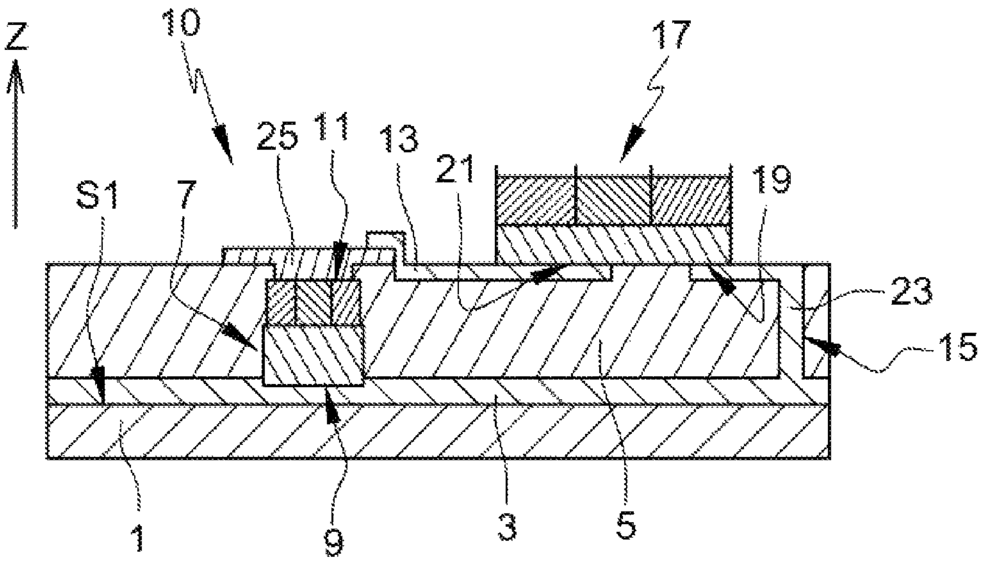
FIG. 1 is a schematic sectional view of an electronic system according to a particular embodiment of the disclosure.

As illustrated in FIG. 1, the disclosure firstly relates to an electronic system 10 comprising a support 1 having an upper surface S1 and at least one initial electronic device 7. For example, the initial electronic device 7 may be an optoelectronic device comprising a light-emitting element. Said light-emitting element may comprise at least one LED light-emitting diode able to emit and/or capture light, and possibly an electronic control component associated with said at least one light-emitting diode, such as a transistor, for example. The at least one initial electronic device 7 comprises a lower connection terminal 9 and an upper connection terminal 11. The lower 9 and upper 11 connection terminals are located at opposite ends of the initial electronic device 7, and in particular on opposite faces of the initial electronic device 7. In general, said lower 9 and upper 11 connection terminals are configured to allow supplying the initial electronic device 7 with electrical energy. As illustrated in FIG. 1, the lower and upper connection terminals 9, 11 are located at opposite ends of the initial electronic device 7, opposite according to a transverse direction denoted "ZZ", directed orthogonally to the upper surface S1 of the support 1.

Figure 3:
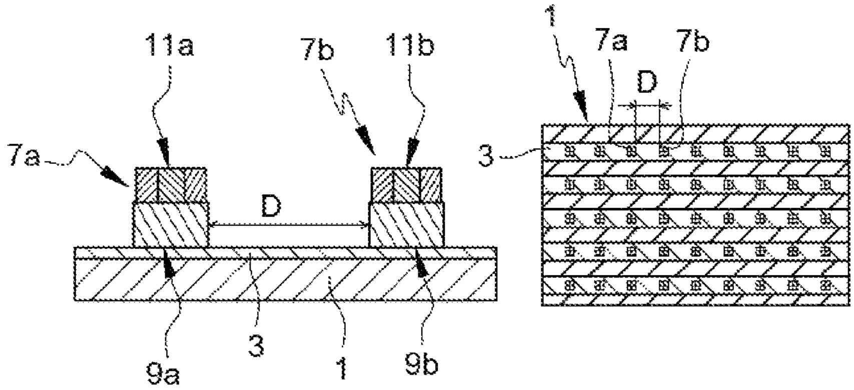
FIG. 3 is a schematic view of the step of placing the initial electronic device according to an embodiment of the disclosure, viewed in section and viewed from the top.

According to the embodiment illustrated in FIG. 3, the electronic system 10 may comprise a plurality of initial electronic devices 7*a*, 7*b*. For example, the electronic system 10 may comprise a first initial electronic device 7*a* comprising a first upper connection terminal 11*a* and a first lower connection terminal 9*a*, and a second initial electronic device 7*b* distinct from the first initial electronic device 7*a*, and comprising a second upper connection terminal 11*b* and a second lower connection terminal 9*b*. In particular, it may be provided that the initial electronic devices 7*a*, 7*b* are distributed over the upper surface S1 of the support 1 according to a predetermined spacing denoted "D". For example, the predetermined spacing D may be defined as the spacing separating two initial electronic devices 7 on the support 1 at the end of a manufacturing process. For example, the predetermined spacing D may be comprised between 50 μm and 2 mm, and more particularly substantially equal to 100 μm.

Moreover, the electronic system 10 comprises a lower electrically-conductive element 3 formed on the upper surface S1 of the support 1. Said lower electrically-conductive element 3 is configured to be electrically connected to the lower connection terminal 9 of said at least one initial electronic device 7. In the case where the electronic system 10 comprises a number of initial electronic devices 7*a*, 7*b* greater than or equal to two, the first and second lower connection terminals 9*a*, 9*b* may be electrically connected to each other via the lower electrically-conductive element 3. In particular, each lower electrically-conductive element 3 may comprise several electrically-conductive tracks extending substantially parallel to each other, on which the lower connection terminals 9*a*, 9*b* of the initial electronic devices 7*a*, 7*b* may be connected.

The electronic system 10 further comprises an electrically-insulating interlayer 5 having a lower face directed towards the upper surface S1 of the support 1, so as to cover all or part of the lower electrically-conductive element 3. Moreover, said electrically-insulating interlayer 5 is configured to cooperate with the initial electronic device 7 in a manner ensuring electrical insulation between the lower electrically-conductive element 3 and the upper connection terminal 11. Hence, it should be well understood that the electrically-insulating interlayer 5 is made of an electrically insulating material. Moreover, and advantageously, it may be provided that the at least one initial electronic device 7 is encapsulated in the electrically-insulating interlayer 5. For example, the electrically-insulating interlayer 5 may be made of a planarization material configured to encapsulate a plurality of initial electronic devices 7*a*, 7*b*.

Moreover, the electronic system comprises at least one upper electrically-conductive element 13 formed at an upper face of the electrically-insulating interlayer 5, on the side opposite to the lower electrically-conductive element 3 with respect to the electrically-insulating interlayer 5. Said at least one upper electrically-conductive element 13 is configured to be connected to the upper connection terminal 11 of said at least one initial electronic device 7. For example, each upper electrically-conductive element 13 comprises several electrically-conductive tracks extending substantially parallel to each other. For example, these electrically-conductive tracks of the lower electrically-conductive element 3 may extend substantially perpendicularly to the electrically-conductive tracks of the upper electrically-conductive element 13. In this manner, it is possible to connect the initial electronic devices 7 unitarily and in a matrix-like fashion via the lower and upper electrically-conductive elements 3, 13. In this case, a first upper electrically-conductive element 13*a* may be placed in electrical connection with the first upper connection terminal 11*a* of a first initial electronic device 7*a*, and a second upper electrically-conductive element 13*b*, distinct from the first upper electrically-conductive element 13*a*, may be placed in electrical connection with the second upper connection terminal 11*b* of a second initial electronic device 7*b*. Hence, one should clearly understand that in the case of a matrix-like distribution of the initial electronic devices 7*a*, 7*b* over the initial surface S1 of the support 1:

- the initial electronic devices 7 arranged on the same line will be connected to the same electrically-conductive track of the lower electrically-conductive element 3, and connected to two different electrically-conductive tracks of the upper electrically-conductive element 13; and
- the initial electronic devices 7 arranged on the same column will be connected to the same electrically-conductive track of the upper electrically-conductive element 13, and connected to two different electrically-conductive tracks of the lower electrically-conductive element 3.

Moreover, the electronic system 10 comprises a pre-existing structure providing access to the lower electrically-conductive element 3 from the upper face of the electrically-insulating interlayer 5. In general, the pre-existing structure opens out at the level of the upper face of the electrically-insulating interlayer 5 in an access area, said access area being disjoint from the upper electrically-conductive element 13. In this manner, it is possible, via the pre-existing structure, to allow access for an electrical connection with the lower electrically-conductive element 3 without creating a short-circuit between the lower connection terminal 9 and the upper connection terminal 11 of the initial electronic device 7. In other words, the pre-existing structure is disjoint from the upper connection terminal 11 and/or from the upper electrically-conductive element 13.

According to an embodiment represented in FIG. 1, the pre-existing structure comprises a transverse conduit 15 crossing the electrically-insulating interlayer 5 transversely, and defining a passage through the electrically-insulating interlayer 5 between the lower electrically-conductive element 3 and an upper orifice opening out onto the upper face of the electrically-insulating interlayer 5. According to a variant represented in FIG. 7, in which the electronic system comprises a plurality of upper electrically-conductive elements 13*a*, 13*b*, or an upper electrically-conductive element 13 having several electrically-conductive tracks, the pre-existing structure and in particular the transverse conduit 15 may open out onto the upper face of the electrically-insulating interlayer 5 in an area located between the first upper electrically-conductive element 13*a* and the second upper electrically-conductive element 13*b*, or between two electrically-conductive tracks of the upper electrically-conductive element 13.

Figure 6:
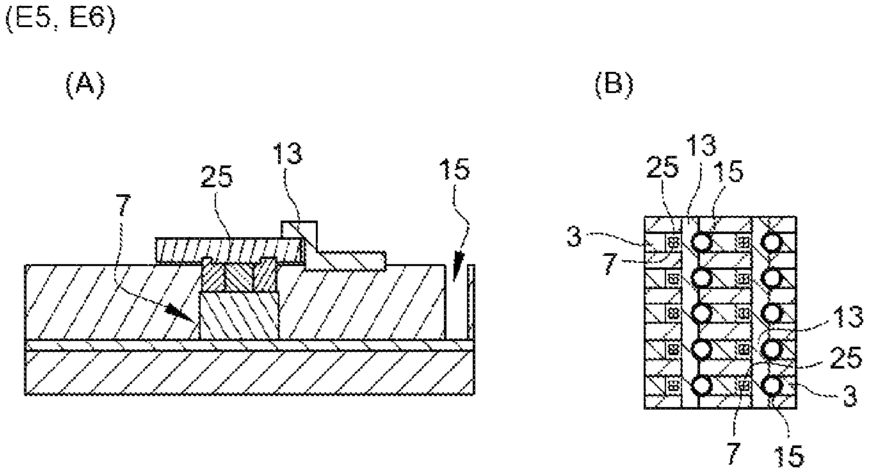
FIG. 6 is a schematic view of some steps of the manufacturing method according to an embodiment of the disclosure, viewed in section and viewed from the top.
Figure 7:
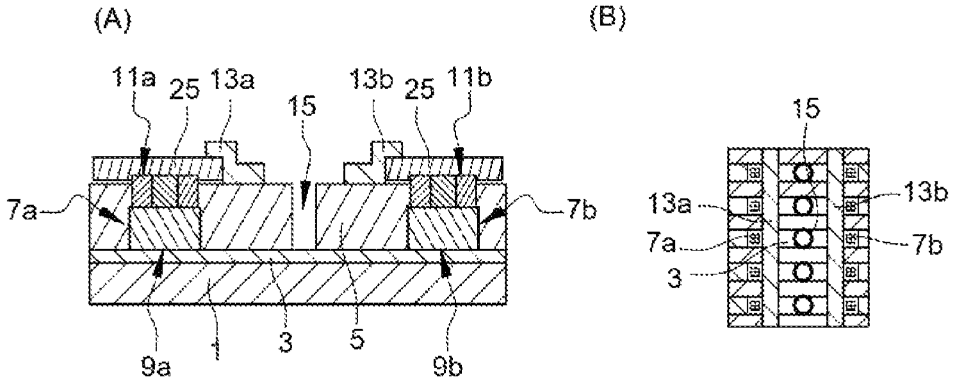
FIG. 7 is a schematic view of some steps of the manufacturing method according to an embodiment of the disclosure, viewed in section and viewed from the top.

As illustrated in FIGS. 6 and 7, at least one portion of the upper face of the electrically-insulating interlayer 5 and at least one portion of the at least one upper electrically-conductive element 13 may define a docking location configured to receive an auxiliary electronic device 17 which is able to be functionally substituted for the initial electronic device 7. Advantageously, the auxiliary electronic device 17 may be an electronic device identical to the initial electronic device 7, or of the same nature as the initial electronic device 7, and may comprise a primary connection terminal 19 configured to be electrically connected to the lower electrically-conductive element 3, and a secondary connection terminal 21 configured to be electrically connected to the upper electrically-conductive element 13.

By "devices of the same nature", it should be understood electronic devices able to fill the same function. For example, devices able to emit light, and/or devices able to capture light, and/or devices able to emit light at a given wavelength. Hence, one should clearly understand that devices of the same nature may have different dimensions and/or a different structure as long as they fill the same function.

According to one embodiment, said primary 19 and secondary 21 connection terminals are arranged on a connection face of the auxiliary electronic device 17 arranged opposite the upper face of the electrically-insulating interlayer 5. In other words, the primary 19 and secondary 21 connection terminals are arranged on the same connection face of the auxiliary electronic device 17, which is directed towards the upper face of the electrically-insulating interlayer 5. Moreover, the auxiliary electronic device 17 may define a volume strictly larger than a volume defined by the at least one initial electronic device 7. In other words, each auxiliary electronic device 17 is larger than the initial electronic device 7 that it is intended to replace. Thus, and advantageously, it is easier to handle the auxiliary electronic device 17 to perform placement thereof over the upper face of the electrically-insulating interlayer 5.

According to one embodiment, the largest dimension of the auxiliary electronic device is strictly larger than the largest dimension of the at least one initial electronic device.

According to one embodiment, the electronic system 10 may comprise at least two docking locations, said docking locations being defined by two distinct areas each covering a portion of the at least one element upper electrically-conductive device 13 and at least one portion of the face of the electrically-insulating interlayer 5. In this manner, it is possible to proceed with the placement of several initial electronic devices 17 on each docking location. Hence, one should clearly understand that the principle of the previously-described arrangements allows replacing the initial electronic device 7 when it is defective by placing the electronic device auxiliary 17 at the level of the docking location. Advantageously, the transverse conduit 15 allows connecting the auxiliary electronic device 17 to the lower electrically-conductive element 3. Moreover, the auxiliary electronic device 17 may be connected to the upper electrically-conductive element 13. According to the embodiment illustrated in FIG. 7, it may be provided to form the transverse conduit 15 between a first upper electrically-conductive element 13*a* electrically connected to a first initial electronic device 7*a*, and a second upper electrically-conductive element 13*b* connected to a second initial electronic device 7*b*, so as to define two distinct docking locations arranged on either side of the transverse conduit 15. Thus, it is possible to selectively substitute either the first initial electronic device 7*a*, or the second initial electronic device 7*b*, by an auxiliary electronic device 17, and that being so via one single transverse conduit 15.

As illustrated in FIGS. 10 to 13, the electronic system 10 may comprise an interposer connector 23 arranged inside a volume delimited by the transverse conduit 15. The interposer connector 23 is configured to be placed in electrical connection with the lower electrically-conductive element 3, and opening out through the upper orifice of the transverse conduit 15. The electronic system 10 may further comprise an electrical connection member 22 configured to ensure an electrical connection between the auxiliary electronic device 17 and the interposer connector 23.

Figure 10:
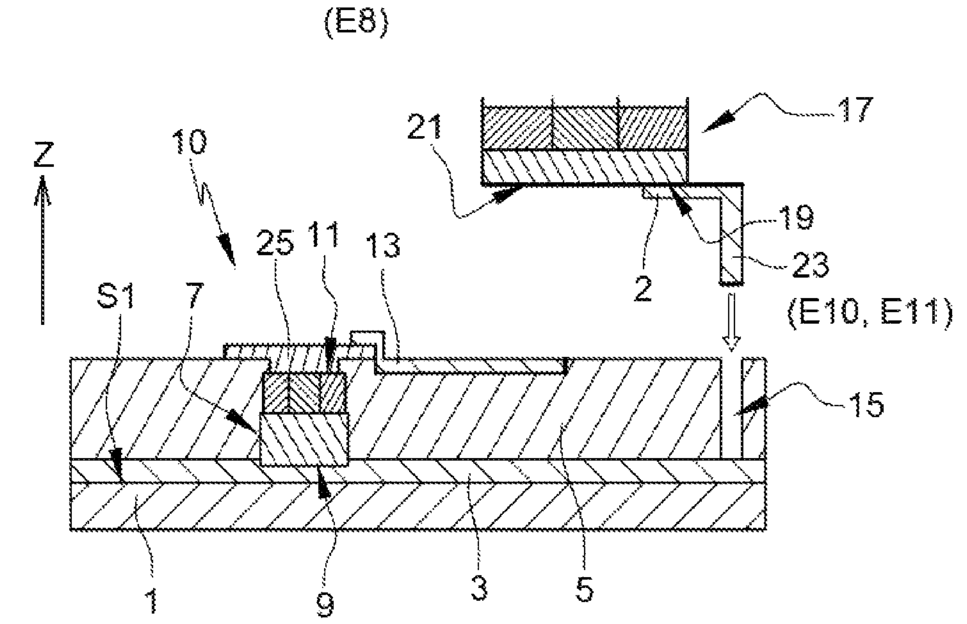
FIG. 10 is a schematic view of some steps of the manufacturing method according to an embodiment of the disclosure, viewed in section.

According to a first embodiment represented in FIG. 10, the auxiliary electronic device 17 comprises the interposer connector 23. In addition, the electrical connection member 22 may be included on the interposer connector 23. In this case, the electrical connection member 22 and the interposer connector 23 form one single part connected to the primary connection terminal 19 of the auxiliary electronic device 17. In other words, the connection member 22 may be included on the primary connection terminal 19 of the auxiliary electronic device 17. According to these arrangements, the interposer connector 23 may be provided on the auxiliary electronic device 17 so that it could be inserted into the transverse conduit 15.

Figure 11:
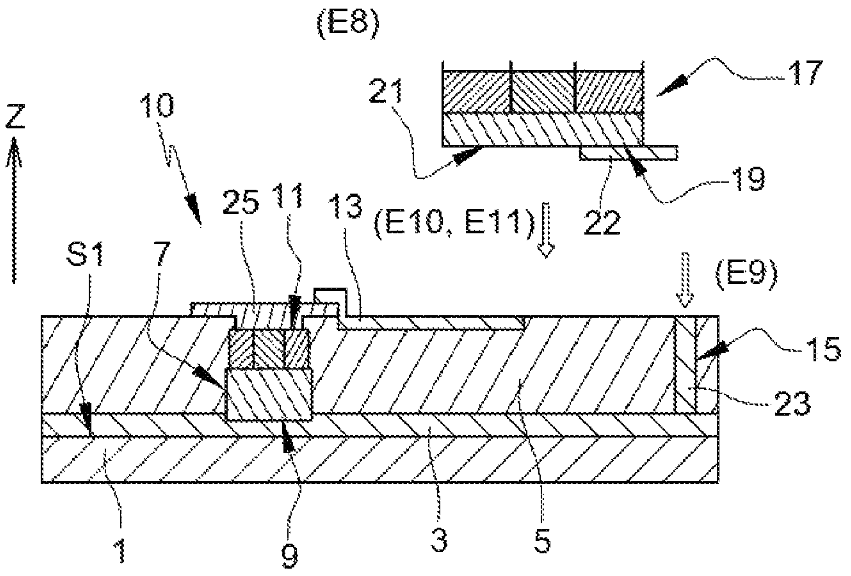
FIG. 11 is a schematic view of some steps of the manufacturing method according to an embodiment of the disclosure, viewed in section.

According to a second embodiment represented in FIG. 11, the interposer connector 23 may comprise a metal deposited in the transverse conduit 15 so as to fill all or part of a volume defined by the transverse conduit 15. In this case, the auxiliary electronic device 17 may be connected to the lower electrically-conductive element 3 via the interposer connector 23, and possibly by an electrical connection member 22 connected to the primary connection terminal 19.

Figure 12:
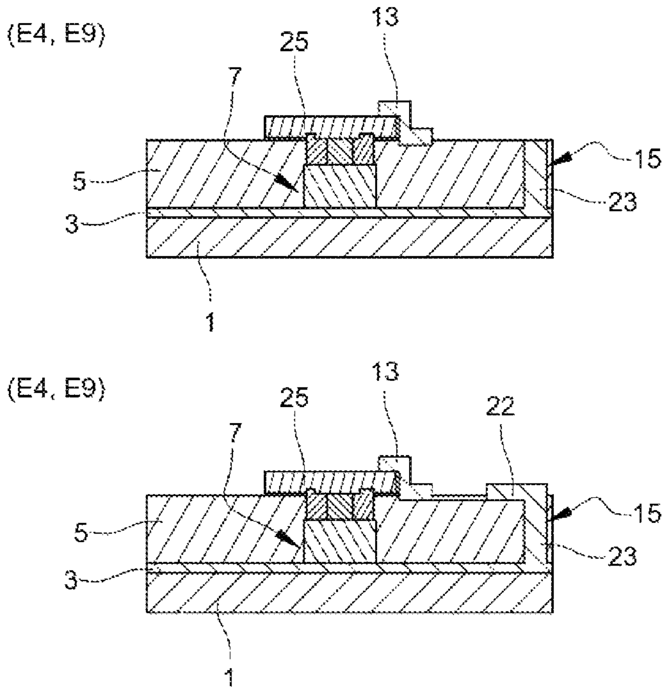
FIG. 12 is a schematic view of some steps of the manufacturing method according to an embodiment of the disclosure, viewed in section.
Figure 13:
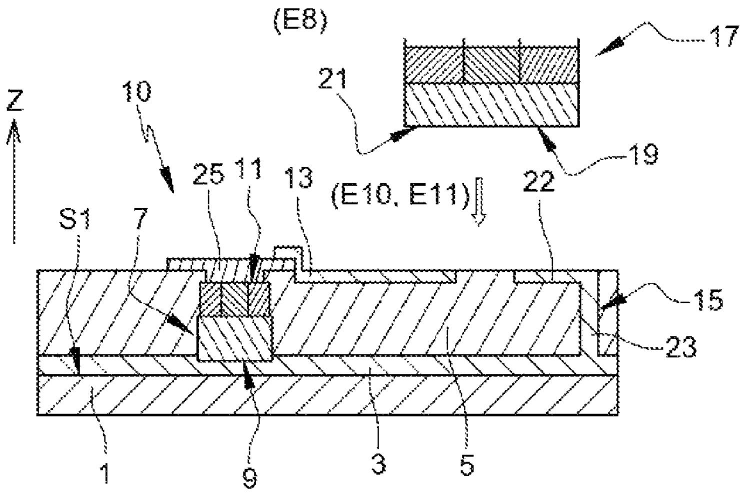
FIG. 13 is a schematic view of some steps of the manufacturing method according to an embodiment of the disclosure, viewed in section.

According to a third embodiment shown in FIGS. 12 and 13, the interposer connector 23, and the electrical connection member 22 may be provided respectively in the transverse conduit 15 and over the electrically-insulating interlayer 5 to enable the connection of the auxiliary electronic device 17. The auxiliary electronic device 17 may comprise a primary connection terminal 19 and a secondary connection terminal 21. Unlike the lower 9 and upper 11 terminals of the initial electronic device 7 located at opposite ends of the initial electronic device 7, the primary 19 and secondary 21 connection terminals may be arranged on the same connection face of the auxiliary electronic device 17. In this case, the secondary connection terminal 21 may be electrically connected with the upper electrically-conductive element 13, and the primary connection terminal 19 may be electrically connected with the interposer connector 23 opening out through the upper orifice of the transverse conduit 15, or with the electrical connection member 22.

Thus, and advantageously, the connection face of the auxiliary electronic device 17 may be simply placed over the upper electrically-conductive element 13, and over the connection member 22 to replace the initial electronic device 7. Hence, the repair of the initial electronic device 7 is carried out by placing the auxiliary electronic device 17 in the right place, that is to say by electrically connecting the secondary connection terminal 21 with the upper electrically-conductive element 13, and by electrically connecting the primary connection terminal 19 with the connection member 22.

Figure 15:
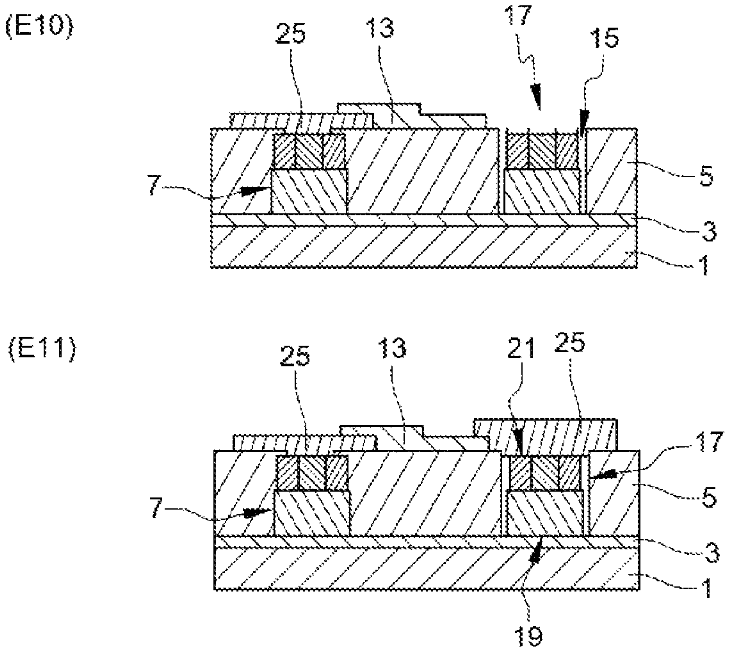
FIG. 15 is a schematic view of some steps of the manufacturing method according to an embodiment of the disclosure, viewed in section.

Finally, referring to FIG. 15, the auxiliary electronic device 17 may comprise a primary connection terminal 19, and may be configured to be able to be inserted into the transverse conduit 15 in a manner ensuring an electrical connection between the primary connection terminal 19, and the lower electrically-conductive element 3. In this case, the auxiliary electronic device 17 may be provided to have an outer contour dimension strictly smaller than an inner dimension of the transverse conduit 15, to be able to be inserted into the transverse conduit 15.

Figure 16:
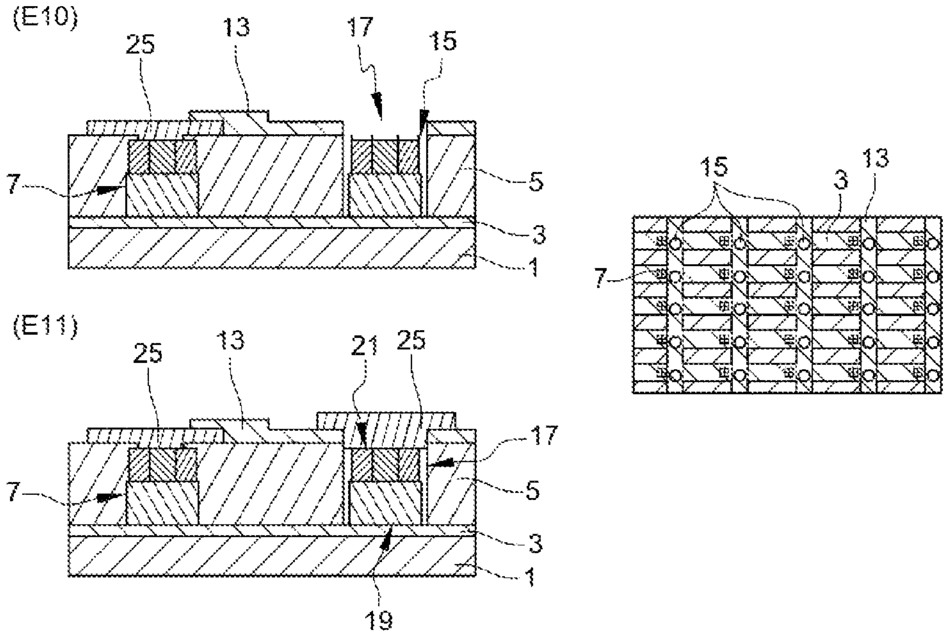
FIG. 16 is a schematic view of some steps of the manufacturing method according to an embodiment of the disclosure, viewed in section and viewed from the top.

According to a variant represented in FIG. 16, the transverse conduit 15 crosses the upper electrically-conductive element 13. In this case, the auxiliary electronic device 17 may be inserted into the transverse conduit 15 in a manner ensuring an electrical connection between the primary connection terminal 19, and the lower electrically-conductive element 3.

Figure 17:
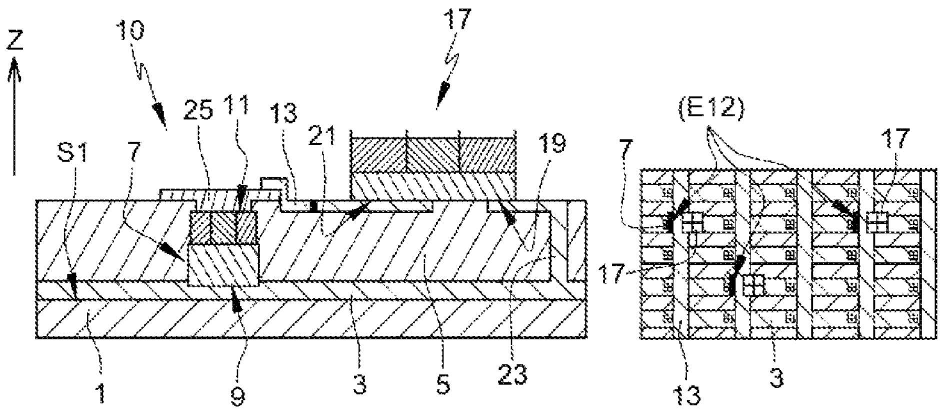
FIG. 17 is a schematic view of some steps of the manufacturing method according to an embodiment of the disclosure, viewed in section and viewed from the top.

According to a variant represented in FIG. 17, the electronic system 1 may comprise at least one initial electronic device 7 comprising a lower connection terminal 9 directed towards the lower electrically-conductive element 3, and an upper connection terminal 11 opposite to the lower connection terminal 9. The electronic system 1 may further comprise an auxiliary electronic device 17 comprising a primary connection terminal 19, and a secondary connection terminal 21 arranged on the same side of the auxiliary electronic device 17, and directed towards the upper face of the electrically-insulating interlayer 5. The primary connection terminal 19 of the auxiliary electronic device 17 being electrically connected to the lower electrically-conductive element 3 via the interposer connector 23, crossing the electrically-insulating interlayer 5, and the secondary connection terminal 21 being electrically connected to the upper electrically-conductive element 13.

The previously-described arrangements allow providing an electronic system 10 comprising a pre-existing structure, such as a transverse conduit 15, which is configured to allow access to the lower electrically-conductive element 3 once the initial electronic device 7 is encapsulated in the electrically-insulating interlayer 5. Thus, it is possible to make an electrical connection with the lower electrically-conductive element 3 during the design of the electronic system 10 and in particular after encapsulation of the electronic devices 7.

With reference to FIGS. 2 to 17, the disclosure also relates to a method for manufacturing an electronic system 10.

First, the manufacturing method comprises a step E0 of providing an electronic system 10 comprising a support 1 having an initial surface S1, at least one initial electronic device 7, and an electrically-insulating interlayer 5. The initial electronic device 7 comprises a lower connection terminal 9 and an upper connection terminal 11, said lower 9 and upper 11 connection terminals being located at opposite ends of the initial electronic device 7. The electrically-insulating interlayer 5 has a lower face directed towards the initial surface S1 of the support 1, so as to cover all or part of a lower electrically-conductive element 3 which is in electrical connection with the lower connection terminal 9 of the initial electronic device 7.

Figure 2:
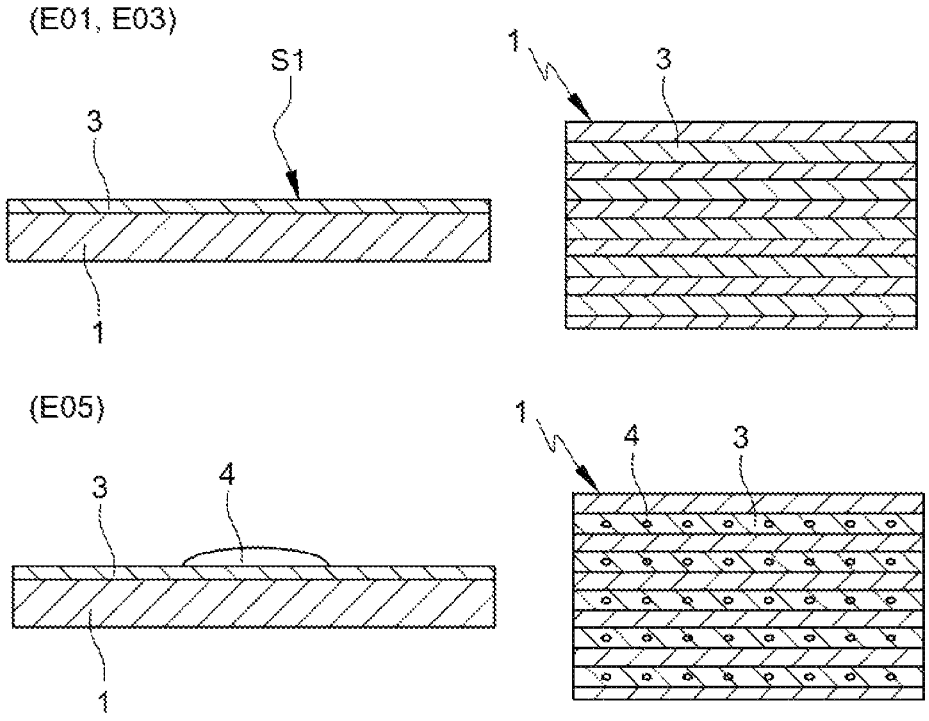
FIG. 2 is a schematic view of some steps of the manufacturing method according to an embodiment of the disclosure, viewed in section and viewed from the top.

According to an embodiment represented in FIG. 2, step E0 of providing the electronic system 10 first comprises a step E01 of providing the support 1 having the upper surface S1. Afterwards, a step E03 of depositing the lower electrically-conductive element 3 over the upper surface S1 of the support 1 may be implemented. For example, and as illustrated in FIG. 2, the lower electrically-conductive element 3 may be deposited so as to form electrically-conductive tracks extending substantially parallel to each other.

Step E0 of providing the electronic system 10 may further comprise a step E05 of depositing a securing means 4, for example an adhesive. The securing means 4 may be configured to secure the initial electronic device 7 to the upper surface S1 of the support 1.

Referring to FIG. 3, a step E07 of placing the initial electronic device 7 over the upper surface S1 may be implemented, in a manner ensuring an electrical connection between the lower connection terminal 9 of the initial electronic device 7 and the lower electrically-conductive element 3. According to the embodiment represented in FIG. 3, step E07 of placing the initial electronic device 7 comprises the distribution of a plurality of initial electronic devices 7*a*, 7*b* over the upper surface S1 of the support 1 at a predetermined spacing D. For example, the predetermined spacing D may be defined as the spacing separating two electronic devices 7*a*, 7*b* on the support 1. For example, the predetermined spacing D may be comprised between 50 μm and 2 mm, and more particularly substantially equal to 100 μm.

Figure 4:
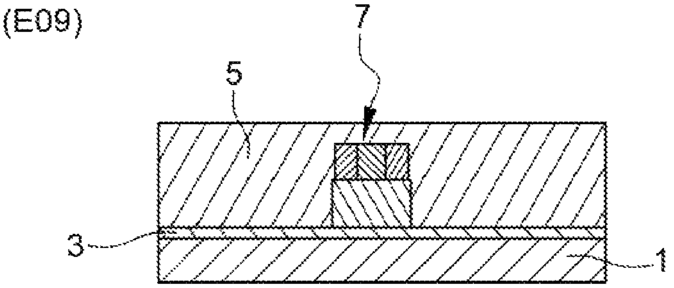
FIG. 4 a schematic view of some steps of the manufacturing method according to an embodiment of the disclosure, viewed in section.
Figure 4:
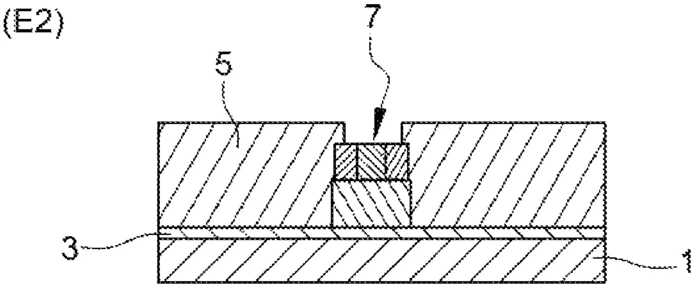

Furthermore, and as illustrated in FIG. 4, step E0 of providing the electronic system 10 may comprise a step E09 of depositing the electrically-insulating interlayer 5 over all or part of the upper surface S1 of the support 1 so as to cover the initial electronic device 7 and the lower electrically-conductive element 3. Hence, one should clearly understand that during this step E09 of depositing the electrically-insulating interlayer 5, each initial electronic device 7 is encapsulated in the electrically-insulating interlayer 5.

Finally, step E0 of providing the electronic system 10 may comprise a step E2 of selectively etching the electrically-insulating interlayer 5 in which the electrically-insulating interlayer 5 is etched so as to provide access to the upper connection terminal 11 of the initial electronic device 7. For example, step E2 of selectively etching the electrically-insulating interlayer 5 comprises the following steps:

- a step of depositing a photoresist layer over the electrically-insulating interlayer 5;
- a step of irradiating the photoresist layer by a light radiation throughout a lithography mask, said lithography mask defining primary areas intended to be irradiated by the light radiation, and secondary areas intended to be protected by the lithography mask against the irradiation of said light radiation;
- a step of developing the photoresist layer in which the photoresist is removed at the level of the primary areas or at the level of the secondary areas, so that the electrically-insulating interlayer 5 is no longer covered with photoresist at the level of said areas where the resin layer has been removed, and such that the electrically-insulating interlayer 5 is covered with the photoresist layer over the other areas;
- an etching step in which an etching of the electrically-insulating interlayer 5 is carried out at the level of the areas not covered by the photoresist layer, and in which an etching of the photoresist layer is carried out on the other areas.

Figure 5:
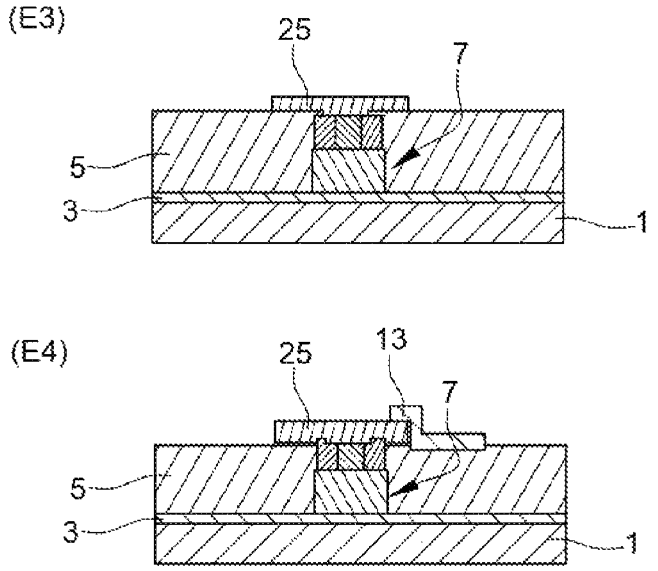
FIG. 5 is a schematic view of some steps of the manufacturing method according to an embodiment of the disclosure, viewed in section.

Referring to FIG. 5, the manufacturing method may comprise a step E3 of depositing a conductive transparent electrode 25, wherein a conductive transparent electrode 25 is deposited at the level of the upper connection terminal 11 of the initial electronic device 7. Advantageously, the use of a conductive transparent electrode 25 allows electrically connecting the upper connection terminal 11 of the initial electronic device 7, but also allowing the initial electronic device to emit a light radiation, which is particularly suitable when the initial electronic device is an optoelectronic device. Step E3 of depositing a conductive transparent electrode 25 is generally implemented before a step E4 of depositing at least one upper electrically-conductive element 13.

Said step E4 of depositing at least one upper electrically-conductive element 13 is carried out over an upper face of the electrically-insulating interlayer 5, on the side opposite the lower electrically-conductive element 3 with respect to the electrically-insulating interlayer 5, in a manner ensuring an electrical connection between the upper connection terminal 11 of said at least one initial electronic device 7 and said upper electrically-conductive element 13. According to one embodiment, during step E4 of depositing the upper electrically-conductive element 13, said deposition of the upper electrically-conductive element 13 is carried out partly over a portion of the transparent electrode conductor 25. Thus, and advantageously, the conductive transparent electrode 25 allows ensuring the electrical contact of the upper connection terminal 11 with the upper electrically-conductive element 13, and enabling the transmission of the light radiation emitted by the initial electronic device 7, which may be an optoelectronic device.

Figure 8:
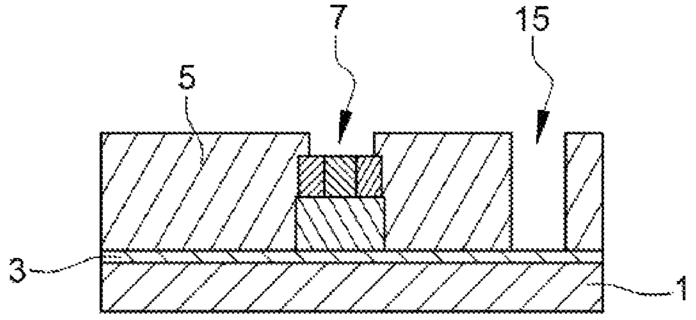
FIG. 8 is a schematic view of some steps of the manufacturing method according to an embodiment of the disclosure, viewed in section.

As illustrated in FIGS. 6 to 8, the manufacturing method comprises a step E5 of forming a pre-existing structure providing access to the lower electrically-conductive element 3 from the upper face of the electrically-insulating interlayer 5. According to an embodiment illustrated in FIGS. 6 to 8, step E5 of forming a pre-existing structure comprises a step E6 of forming a transverse conduit 15, formed in the electrically-insulating interlayer 5, so as to define a passage through the electrically-insulating interlayer 5 between the lower electrically-conductive element 3 and an upper orifice opening out onto the upper face of the electrically-insulating interlayer 5. Hence, one should clearly understand that the upper orifice opens onto the upper face of the electrically-insulating interlayer 5 on the side of the at least one upper electrically-conductive element 13. According to a variant represented in FIG. 6, step E6 of forming the transverse conduit 15 is implemented through the upper electrically-conductive element 13. FIG. 7 illustrates a variant in which step E6 of forming the transverse conduit 15 is done between a first upper electrically-conductive element 13*a* electrically connected to a first initial electronic device 7*a*, and a second upper electrically-conductive element 13*b* connected to a second initial electronic device 7*b*. In this manner, it is possible to access the lower electrically-conductive element 3 common to the two initial electronic devices 7*a*, 7*b* between which the transverse conduit 15 is formed. According to the variant represented in FIG. 8, step E6 of forming the transverse conduit 15 is carried out during step E2 of selectively etching the electrically-insulating interlayer 5.

Figure 9:
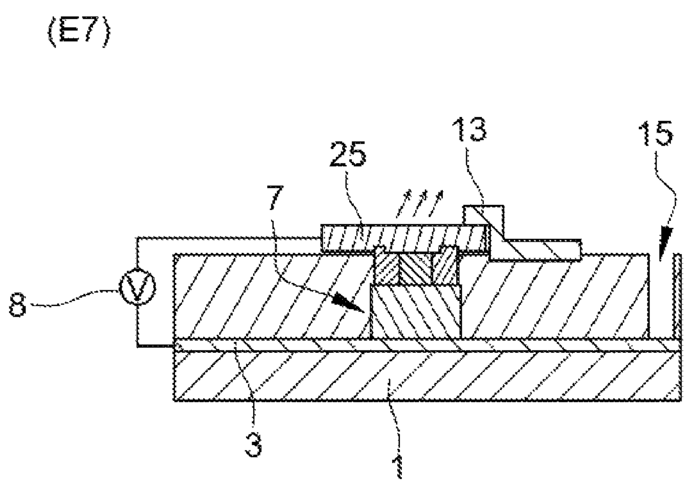
FIG. 9 is a schematic view of the step of controlling the initial electronic device according to an embodiment of the disclosure, viewed in section.

Afterwards, the manufacturing method may comprise a step E7 of controlling the initial electronic device 7 implemented after step E6 of forming the transverse conduit 15 and represented in FIG. 9. During this step E7, the initial electronic device 7 is supplied with electrical energy so as to determine whether said initial electronic device 7 is defective. For example, step E7 of controlling the initial electronic device 7 may comprise measuring a current crossing the initial electronic device 7, or may comprise measuring a voltage at the connection terminals of the initial electronic device 7, for example via a multimeter 8. According to a variant for which the initial electronic device 7 is an optoelectronic device, step E7 of controlling the initial electronic device 7 may comprise placing the initial electronic device 7 in a mode in which it emits a light radiation, then detecting said light radiation via an optical sensor.

The manufacturing method further comprises a repair phase, illustrated in FIGS. 10 to 15. Said repair phase may comprise a step E8 of providing an auxiliary electronic device 17 able to functionally substitute for the initial electronic device 7. Advantageously, the auxiliary electronic device 17 may be an electronic device identical to the initial electronic device 7, or of the same nature as the initial electronic device 7, and may comprise a primary connection terminal 19 configured to be electrically connected to the lower electrically-conductive element 3, and a secondary connection terminal 21 configured to be electrically connected to the upper electrically-conductive element 13. By “devices of the same nature”, it should be understood electronic devices able to fill the same function. For example, devices able to emit light, and/or devices able to capture light, and/or devices able to emit light at a given wavelength. Hence, it should be clearly understood that devices of the same nature may have different dimensions and/or a different structure as long as they fill the same function.

Afterwards, the repair phase may comprise a step E10 of placing said auxiliary electronic device 17 on a docking location, said docking location covering at least one portion of the upper electrically-conductive element 13, and at least one portion of the upper face of the electrically-insulating interlayer 5, said step E10 of placing the auxiliary electronic device 17 being implemented in a manner ensuring an electrical contact between the primary connection terminal 19 of the auxiliary electronic device 17 and the upper electrically-conductive element 13. Finally, the repair phase may comprise a connection step E1, in which a terminal of the primary connection 19 of the auxiliary electronic device 17 is electrically connected to the lower electrically-conductive element 3 via an interposer connector 23 which is able to pass through a volume delimited by the transverse conduit 15.

According to a first variant represented in FIG. 10, the auxiliary electronic device 17 comprises the interposer connector 23 in electrical connection with the primary connection terminal 19 of the auxiliary electronic device 17 in a manner enabling the implementation of the connection step E11. For example, the interposer connector 23 may comprise an electrical connection member 22. In this case, the electrical connection member 22 and the interposer connector 23 form a single part connected to the primary connection terminal 19 of the auxiliary electronic device 17. The interposer connector 23 may then be provided so as to be able to be inserted into the transverse conduit 15 to implement the connection step E11.

According to a second variant represented in FIG. 11, a step E9 of depositing the interposer connector 23 is implemented. During this step E9, a conductive material is deposited in the transverse conduit 15 so as to create an electrical connection between said interposer connector 23 and the lower electrically-conductive element 3, and so that the interposer connector 23 opens out through the upper orifice of the transverse conduit 15. Hence, one should clearly understand that a metal is deposited in the transverse conduit 15 so as to fill all or part of a volume delimited by the transverse conduit 15, and so as to form the interposer connector 23. In this case, the auxiliary electronic device 17 may be connected to the lower electrically-conductive element 3 via the interposer connector 23, and possibly by an electrical connection member 22 connected to the primary connection terminal 19, and configured to ensure an electrical connection between the auxiliary electronic device 17 and the interposer connector 23.

According to a third variant illustrated in FIG. 12, step E9 of depositing the interposer connector 23 also comprises the formation of an electrical connection member 22 configured to ensure an electrical connection between the auxiliary electronic device 17 and the interposer connector 23. According to this variant, the electrical connection member 22 may be deposited over the upper face of the electrically-insulating interlayer 5. Advantageously, step E4 of depositing at least one upper electrically-conductive element 13 may be implemented at the same time as step E9 of depositing the interposer connector 23.

Figure 14:
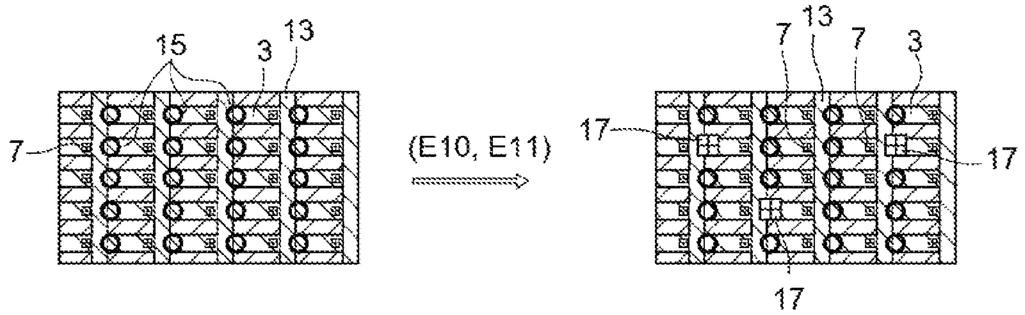
FIG. 14 is a schematic view of some steps of the manufacturing method according to an embodiment of the disclosure, viewed from the top.

Referring to FIGS. 13 and 14, the auxiliary electronic device 17 may comprise a primary connection terminal 19 and a secondary connection terminal 21 arranged on the same connection face of the auxiliary electronic device 17. In this case, the placement step E10 may be carried out by placing the auxiliary electronic device 17 over the interposer connector 23 opening out through the upper orifice of the transverse conduit 15 or over the electrical connection member 22, and over the upper electrically-conductive element 13 at the level of the connection face. Afterwards, the connection step E1 may be implemented by electrically connecting the secondary connection terminal 21 with the upper electrically-conductive element 13, and by electrically connecting the primary connection terminal 19 with the interposer connector 23 opening out through the upper orifice of the transverse conduit 15 or with the electrical connection member 22.

Thus, and advantageously, when step E9 of depositing the interposer connector 23 comprises the deposition of a connection member 22 over the upper face of the electrically-insulating interlayer 5, the connection step E1 may simply be implemented by electrically connecting the secondary connection terminal 21 with the upper electrically-conductive element 13, and by electrically connecting the primary connection terminal 19 with the connection member 22. In other words, The connection step E11 is implemented by electrically connecting the primary 19 and secondary 21 terminals of the auxiliary electronic device 17 on existing electronic tracks. In this manner, it is not necessary to proceed with an additional metal deposition at the time when the auxiliary electronic device 17 is placed to replace the initial electronic device 7. Hence, the repair of the initial electronic device 7 illustrated in FIG. 14 is achieved by placing the auxiliary electronic device 17 in the right place.

According to a fourth variant illustrated in FIG. 15, the auxiliary electronic device 17 may be deposited directly in the transverse conduit 15 in a manner enabling the implementation of step E10 of placing the auxiliary electronic device 17, and the connection step E11. According to this embodiment, the primary 19 and secondary 21 connection terminals are located at opposite ends of the auxiliary electronic device 17. Thus, the auxiliary electronic device 17 is identical or of the same type as the initial electronic device 7. According to this variant, a second step of depositing a conductive transparent electrode 25 may be implemented, in which a conductive transparent electrode 25 is deposited at the level of the secondary terminal 21 of the auxiliary electronic device 17 so as to electrically connect the auxiliary electronic device 17 to the at least one upper electrically-conductive element 13.

According to a fourth variant represented in FIG. 16, step E6 of forming the transverse conduit 15 is carried out through the upper electrically-conductive element 13. For example, the upper electrically-conductive element 13 may serve as a mask to carry out step E6 of forming the transverse conduit 15. In this case, the auxiliary electronic device 17 may be deposited directly in the transverse conduit 15 in a manner enabling the implementation of step E10 of placing the auxiliary electronic device 17, and the connection step E11. Afterwards, the manufacturing method may comprise a second step of depositing a conductive transparent electrode 25, in which a conductive transparent electrode 25 is deposited at the level of the secondary terminal 21 of the auxiliary electronic device 17 so as to electrically connect the auxiliary electronic device 17 to the at least one upper electrically-conductive element 13.

Finally, as illustrated in FIG. 17, the manufacturing method comprises a disconnection step E12, in which the electrical connection between the upper connection terminal 11 of the initial electronic device 7 and the upper electrically-conductive element 13 is broken, in particular by laser etching. In this manner, it is possible to cut off the electrical connection between the upper electrically-conductive element 13 and the upper connection terminal 11 of the initial electronic device 7 so that it does not cause a short-circuit or interferences with the auxiliary electronic device 17.

According to an embodiment which is not represented, the manufacturing method further comprises a protection step comprising the deposition of a protective insulating layer over the auxiliary electronic device 17.

For example, said protection step may comprise the encapsulation of the auxiliary electronic device 17 by a protective insulating layer, the surface of which corresponds, within a 10% margin, to a surface occupied by the auxiliary electronic device 17. In this case, the protective insulating layer is deposited punctually at the level of each auxiliary electronic device 17 to be protected.

Alternatively, said protection step may comprise the encapsulation of the entirety of the upper face of the electrically-insulating interlayer 5, or of the entirety of the electronic system 10.

According to one embodiment, the protection step is implemented after the connection step E11. In this manner, the protective insulating layer allows both encapsulating the auxiliary electronic devices 17, but also blocking access to the lower electrically-conductive element 3 from the upper face of the electrically-insulating interlayer 5. Thus, it is possible to limit the degradation of the upper electrically-conductive element 13, and of the upper electrically-conductive element 3, while avoiding short-circuits.

All of the previously-described arrangements allow providing a method for manufacturing an electronic system 10 comprising means for enabling the repair of a defective initial electronic device 7. Indeed, step E6 of forming the transverse conduit 15 made, for example, by etching the electrically-insulating interlayer 5, allows providing access to the lower electrically-conductive element 3, in particular after a step E09 of depositing the electrically-insulating interlayer 5.

The invention claimed is:

1. An electronic system comprising:

a support having an upper surface;

at least one initial electronic device comprising a lower connection terminal and an upper connection terminal, said lower and upper connection terminals being located at opposite ends of the initial electronic device;

a lower electrically-conductive element formed on the upper surface of said support and configured to be electrically connected to the lower connection terminal of said at least one initial electronic device;

an electrically-insulating interlayer having a lower face facing the upper surface of the support, so as to cover all or part of the lower electrically-conductive element, said electrically-insulating interlayer being configured to cooperate with the initial electronic device in a manner ensuring electrical insulation between the lower electrically-conductive element and the upper connection terminal;

at least one upper electrically-conductive element formed on an upper face of the electrically-insulating interlayer, on the side opposite to the lower electrically-conductive element with respect to the electrically-insulating interlayer, said at least one upper electrically-conductive element being configured to be connected to the upper connection terminal of said at least one initial electronic device;

a structure providing access to the lower electrically-conductive element from the upper face of the electrically-insulating interlayer;

wherein the at least one initial electronic device comprises a first initial electronic device comprising a first upper connection terminal and a first lower connection terminal, and a second initial electronic device distinct from the first initial electronic device, and comprising a second upper connection terminal and a second lower connection terminal, said first and second lower connection terminals being electrically connected to each other via the lower electrically-conductive element;

wherein a first upper electrically-conductive element is in electrical connection with the first upper connection terminal; and a second upper electrically-conductive element, distinct from the first upper electrically-conductive element, is in electrical connection with the second upper connection terminal; and wherein the structure is opening out onto the upper face of the electrically-insulating interlayer in an area located between the first upper electrically-conductive element and the second upper electrically-conductive element.

2. The electronic system according to claim 1, wherein the structure comprises a transverse conduit passing transversely through the electrically-insulating interlayer, and defining a passage through the electrically-insulating interlayer between the lower electrically-conductive element and an upper orifice opening out onto the upper face of the electrically-insulating interlayer.

3. The electronic system according to claim 2, comprising an interposer connector arranged inside a volume delimited by the transverse conduit, said interposer connector being in electrical connection with the lower electrically-conductive element, and opening out through the upper orifice of the transverse conduit.

4. The electronic system according to claim 2, comprising an auxiliary electronic device, said auxiliary electronic device comprising a primary connection terminal, and being configured to be able to be inserted into the transverse conduit in a manner ensuring an electrical connection between the primary connection terminal, and the lower electrically-conductive element.

5. The electronic system according to any claim 3, wherein at least one portion of the upper face of the electrically-insulating interlayer and at least one portion of the at least one upper electrically-conductive element define a docking location configured to receive an auxiliary electronic device which is able to operatively substitute for the initial electronic device.

6. The electronic system according to claim 5, wherein the auxiliary electronic device comprises the interposer connector.

7. The electronic system according to claim 5, wherein the auxiliary electronic device comprises a primary connection terminal configured to be electrically connected to the lower electrically-conductive element, and a secondary connection terminal configured to be electrically connected to the upper electrically-conductive element, said primary connection terminal and secondary connection terminal being arranged on a connection face of the auxiliary electronic device arranged opposite the upper face of the electrically-insulating interlayer.

8. The electronic system according to claim 5, wherein the auxiliary electronic device defines a volume strictly larger than a volume defined by the at least one initial electronic device.

9. The electronic system according to any claim 1, wherein the initial electronic device is an optoelectronic device comprising a light-emitting element.

10. The electronic system according to any claim 1, wherein each lower electrically-conductive element comprises several electrically-conductive tracks extending substantially parallel to each other, wherein each upper electrically-conductive element comprises several electrically-conductive tracks extending substantially parallel to each other, and wherein the electrically-conductive tracks of the lower electrically-conductive element extend substantially perpendicular to the electrically-conductive tracks of the upper electrically-conductive element.

11. A method for manufacturing an electronic system comprising the following steps:

a step of providing an electronic system comprising a support having an initial surface, at least one initial electronic device, and an electrically-insulating interlayer, said initial electronic device comprising a lower connection terminal and an upper connection terminal, said lower and upper connection terminals being located at opposite ends of the initial electronic device, said electrically-insulating interlayer having a lower face directed towards the initial surface of the support, so as to cover all or part of a lower electrically-conductive element which is in electrical connection with the lower connection terminal of the initial electronic device;

a step of depositing at least one upper electrically-conductive element over an upper face of the electrically-insulating interlayer, on the side opposite to the lower electrically-conductive element with respect to the electrically-insulating interlayer, in a manner ensuring an electrical connection between the upper connection terminal of said at least one initial electronic device and said upper electrically-conductive element;

a step of forming a structure providing access to the lower electrically-conductive element from the upper face of the electrically-insulating interlayer;

the manufacturing method further comprising a step of depositing a conductive transparent electrode implemented before step of depositing at least one upper electrically-conductive element, wherein a conductive transparent electrode is deposited at the level of the upper connection terminal of the initial electronic device.

12. The manufacturing method according to claim 11, wherein the step of forming a structure comprises a step of forming a transverse conduit, formed in the electrically-insulating interlayer, so as to define a passage through the electrically-insulating interlayer between the lower electrically-conductive element and an upper orifice opening out onto the upper face of the electrically-insulating interlayer.

13. The manufacturing method according to claim 12, comprising a step of controlling the initial electronic device implemented after step of forming the transverse conduit, in which the initial electronic device is supplied with electrical energy so as to determine whether said initial electronic device is defective.

14. The manufacturing method according to claim 12, further comprising a repair phase comprising the steps of:

a step of providing an auxiliary electronic device able to be functionally substituted for the initial electronic device;

a step (E10) of placing said auxiliary electronic device on a docking location, said docking location covering at least one portion of the upper electrically-conductive element, and at least one portion of the upper face of the electrically-insulating interlayer, said step (E10) of placing the auxiliary electronic device being implemented in a manner ensuring an electrical contact between a primary connection terminal of the auxiliary electronic device and the upper electrically-conductive element;

a connection step, in which a primary connection terminal of the auxiliary electronic device is electrically connected with the lower electrically-conductive element via an interposer connector which is able to pass through a volume delimited by the transverse conduit.

15. The manufacturing method according to claim 14, wherein the auxiliary electronic device comprises the interposer connector in electrical connection with the primary connection terminal of the auxiliary electronic device in a manner enabling the implementation of the connection step.

16. The manufacturing method according to claim 14, further comprising a step of depositing the interposer connector, in which a conductive material is deposited in the transverse conduit so as to create a connection between said interposer connector and the lower electrically-conductive element, and so that the interposer connector opens out through the upper orifice of the transverse conduit.

17. The manufacturing method according to claim 14, further comprising a protection step comprising depositing a protective insulating layer over the auxiliary electronic device.

18. The manufacturing method according to claim 16, wherein the auxiliary electronic device comprises a primary connection terminal and a secondary connection terminal, said primary connection terminal and secondary connection terminal being arranged on the same connection face of the auxiliary electronic device, the connection step being implemented by electrically connecting the secondary connection terminal with the upper electrically-conductive element, and by electrically connecting the primary connection terminal to the interposer connector opening out through the upper orifice of the transverse conduit.

19. The manufacturing method according to claim 11, comprising a disconnection step (E12), in which the electrical connection between the upper connection terminal of the initial electronic device and the upper electrically-conductive element is broken, in particular by laser etching.

20. The manufacturing method according to claim 11, wherein the step of providing the electronic system comprises the following steps:

a step (E01) of providing the support having the upper surface;

a step (E03) of depositing the lower electrically-conductive element over the upper surface of the support;

a step (E07) of placing the initial electronic device over the upper surface in a manner ensuring an electrical connection between the lower connection terminal of the initial electronic device and the element lower electrically-conductive;

a step (E09) of depositing the electrically-insulating interlayer over all or part of the upper surface of the support so as to cover the initial electronic device and the lower electrically-conductive element;

a step of selectively etching the electrically-insulating interlayer in which the electrically-insulating interlayer is etched so as to form an access to the upper connection terminal of the device initial electronics.

* * * * *